(12) United States Patent
Shim et al.

(10) Patent No.: US 9,583,371 B2
(45) Date of Patent: Feb. 28, 2017

(54) ELECTROSTATIC CHUCK AND APPARATUS FOR PROCESSING A SUBSTRATE INCLUDING THE SAME

(71) Applicant: SAMSUNG ELECTRONICS CO., LTD., Suwon-si, Gyeonggi-do (KR)

(72) Inventors: Jea-Eun Jess Shim, Hwaseong-si (KR); Jin-Man Kim, Hwaseong-si (KR); Hee-Sam Kim, Hwaseong-si (KR); Jong-Bum Park, Suwon-si (KR); Kwang-Bo Sim, Seongnam-si (KR); Sang-Young Lee, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 262 days.

(21) Appl. No.: 14/108,684

(22) Filed: Dec. 17, 2013

(65) Prior Publication Data

US 2015/0170951 A1 Jun. 18, 2015

(30) Foreign Application Priority Data

Dec. 17, 2013 (KR) ........................ 10-2012-0147263

(51) Int. Cl.
*C23C 16/50* (2006.01)
*C23C 16/00* (2006.01)
*C23F 1/00* (2006.01)
*H01L 21/306* (2006.01)
(Continued)

(52) U.S. Cl.
CPC .... *H01L 21/6833* (2013.01); *H01J 37/32009* (2013.01); *H01J 37/3244* (2013.01); *H01J 37/32091* (2013.01); *H01J 37/32697* (2013.01); *H01J 37/32724* (2013.01)

(58) Field of Classification Search
CPC ...................... H01J 37/32513; H01J 37/32559
USPC ............... 118/724–732; 156/345.51, 345.52, 156/345.53, 345.54, 345.55
See application file for complete search history.

(56) References Cited

U.S. PATENT DOCUMENTS

| 8,125,757 B2 | 2/2012 | Morooka |
| 2005/0042881 A1 * | 2/2005 | Nishimoto .......... H01L 21/6833 438/710 |

(Continued)

FOREIGN PATENT DOCUMENTS

| JP | 2010-016363 | 1/2010 |
| KR | 1020000001894 | 1/2000 |

(Continued)

*Primary Examiner* — Karla Moore
*Assistant Examiner* — Tiffany Nuckols
(74) *Attorney, Agent, or Firm* — .F. Chau & Associates, LLC

(57) ABSTRACT

An ESC may include a dielectric layer, an electrode, a pedestal, a heater, an adhesive and a protecting ring. The dielectric layer may be configured to support a substrate. The electrode may be disposed in the dielectric layer and is configured to form plasma over the substrate. The pedestal may be disposed under the dielectric layer. The heater may be disposed between the pedestal and the dielectric layer and is configured to heat the substrate. The adhesive may be disposed between the pedestal and the heater, and between the heater and the dielectric layer. The protecting ring may be configured to surround the adhesive. The protecting ring may include a plasma-resistant material.

15 Claims, 4 Drawing Sheets

(51) Int. Cl.
H01L 21/683 (2006.01)
H01J 37/32 (2006.01)

(56) References Cited

U.S. PATENT DOCUMENTS

2009/0290145 A1* 11/2009 Howard ............ H01J 37/32642
356/72
2009/0294064 A1* 12/2009 Nagayama ........ H01J 37/32642
156/345.39
2013/0340942 A1* 12/2013 Schaefer ................ F16J 15/021
156/345.51

FOREIGN PATENT DOCUMENTS

| KR | 1020000032024 | 6/2000 |
| KR | 1020040063190 | 7/2004 |
| KR | 1020070070419 | 7/2007 |

* cited by examiner

200b

200c

ELECTROSTATIC CHUCK AND APPARATUS FOR PROCESSING A SUBSTRATE INCLUDING THE SAME

CROSS-RELATED APPLICATION

This application claims priority under 35 USC §119 to Korean Patent Application No. 10-2012-0147263, filed on Dec. 17, 2012, the disclosure of which is hereby incorporated by reference herein in its entirety.

TECHNICAL FIELD

Example embodiments relate to an electrostatic chuck and an apparatus for processing a substrate including the same. More particularly, example embodiments relate to an electrostatic chuck for supporting a substrate using an electrostatic force, and an apparatus for processing a substrate including the electrostatic chuck.

DISCUSSION OF THE RELATED ART

Semiconductor devices may be manufactured by, for example, an etching process, a deposition process, an ion implantation process, etc. An electrostatic chuck (ESC) for supporting a semiconductor substrate using an electrostatic force may be used in the processes.

The ESC may include, for example, a dielectric layer, an electrode built in the dielectric layer, a pedestal arranged under the dielectric layer, and a heater arranged between the pedestal and the dielectric layer. The heater may be attached to the pedestal and the dielectric layer using, for example, an adhesive.

When the adhesive is exposed to plasma, the adhesive may be worn. The worn adhesive may result in exposing an edge portion of the pedestal. An arcing may be generated from the exposed edge portion of the pedestal. Further, particles generated from the worn adhesive may have a negative influence on the semiconductor devices. To prevent the generation of the particles, the adhesive may be surrounded by, for example, an epoxy.

However, the epoxy may chemically react with the plasma. Thus, when the ESC is used for a long time, the epoxy may be worn. Because the worn epoxy may result in exposing the adhesive, the above-mentioned difficulties may still remain.

SUMMARY

Example embodiments provide an ESC capable of preventing an adhesive from being worn.

Example embodiments also provide an apparatus for processing a substrate including the above-mentioned ESC.

According to an example embodiment, an ESC may be provided. The ESC may include a dielectric layer, an electrode, a pedestal, a heater, an adhesive and a protecting ring. The dielectric layer may be configured to support a substrate. The electrode may be disposed in the dielectric layer and is configured to form plasma over the substrate. The pedestal may be disposed under the dielectric layer. The heater may be disposed between the pedestal and the dielectric layer and is configured to heat the substrate. The adhesive may be disposed between the pedestal and the heater, and between the heater and the dielectric layer. The protecting ring may be configured to surround the adhesive. The protecting ring may include a plasma-resistant material.

In an example embodiment, the protecting ring may be configured to surround the heater.

In an example embodiment, the protecting ring may include a first ring configured to surround the adhesive between the pedestal and the heater, and a second ring configured to surround the adhesive between the heater and the dielectric layer.

In an example embodiment, the protecting ring may include one body.

In an example embodiment, the protecting ring may separate type rings. The separate type rings may have a fixing groove and a fixing projection.

In an example embodiment, the protecting ring may have an outer diameter substantially the same as an outer diameter of the dielectric layer.

In an example embodiment, the protecting ring may include a ceramic.

In an example embodiment, the protecting ring may include a metal.

In an example embodiment, the ESC may further include a cooling line connected to the dielectric layer through the pedestal, the adhesive and the heater.

According to an example embodiment, an apparatus for processing a substrate is provided. The apparatus may include a reaction chamber, an ESC and a processing unit. The ESC may be disposed in the reaction chamber and is configured to support the substrate using an electrostatic force. The ESC may include a dielectric layer, an electrode, a pedestal, a heater, an adhesive and a protecting ring. The dielectric layer may be configured to support the substrate. The electrode may be disposed in the dielectric layer and is configured to form plasma over the substrate. The pedestal may be disposed under the dielectric layer. The heater may be disposed between the pedestal and the dielectric layer and is configured to heat the substrate. The adhesive may be disposed between the pedestal and the heater, and between the heater and the dielectric layer. The protecting ring may be configured to surround the adhesive. The protecting ring may include a plasma-resistant material. The processing unit may be disposed in the reaction chamber and is configured to process the substrate.

In an example embodiment, the processing apparatus may include a reaction gas line configured to supply a reaction gas to the substrate, and a showerhead connected to the reaction gas line and which is configured to spray the reaction gas to the substrate. The showerhead and the electrode may together form the plasma from the reaction gas.

In an example embodiment, the processing apparatus may include a reaction gas line configured to supply a reaction gas to the substrate, and a radio frequency (RF) antenna configured to form plasma ions from the reaction gas together with the electrode.

In an example embodiment, the processing apparatus may include an ion beam-irradiating unit configured to irradiate an ion beam to the substrate.

In an example embodiment, the ion beam-irradiating unit may be disposed at an upper surface of the reaction chamber and is configured to irradiate the ion beam to the ESC in a vertical direction.

In an example embodiment, the ion beam-irradiating unit may be disposed at a side surface of the reaction chamber and is configured to irradiate the ion beam to the ESC in a horizontal direction. The apparatus may further include a rotating unit configured to rotate the ESC to be disposed opposite to the ion beam-irradiating unit. In an example embodiment, an electrostatic chuck (ESC) is provided. The ESC includes a dielectric layer configured to support a substrate, an electrode disposed in the dielectric layer and configured to form plasma over the substrate, a pedestal disposed under the dielectric layer, in which the pedestal has an outer diameter substantially the same as an outer diameter of the dielectric layer, and a heater disposed between the pedestal and the dielectric layer and configured to heat the substrate. The heater has an outer diameter shorter than the outer diameter of the pedestal and the outer diameter of the dielectric layer.

In addition, the ESC further includes a lower adhesive disposed between the pedestal and the heater and configured to attach a lower surface of the heater to an upper surface of the pedestal, an upper adhesive disposed between the heater and the dielectric layer and configured to attach an upper surface of the heater to a lower surface of the dielectric layer, and a protecting ring including a plasma-resistant material. An outer diameter of the lower adhesive is substantially the same as an outer diameter of the upper adhesive and the outer diameter of the heater is substantially the same as the outer diameter of the lower adhesive and the outer diameter of the upper adhesive. The protecting ring includes an upper ring configured to surround the upper adhesive and a lower ring configured to surround the lower adhesive. The lower ring and the upper ring do not surround the heater such that the heater is exposed through the protecting ring and the protecting ring has a side outer surface substantially coplanar with side outer surfaces of the dielectric layer and the pedestal.

According to example embodiments, the protecting ring having a plasma-resistant material may surround the adhesive so that the adhesive may not be exposed to the plasma owing to the protecting ring. Further, because the protecting ring may be a separate part from the dielectric layer or the pedestal, only the protecting ring may need to be replaced in the event that the protecting ring is worn or damaged. Therefore, the ESC may have a long life span and particles may not be generated.

BRIEF DESCRIPTION OF THE DRAWINGS

Example embodiments can be more clearly understood from the following detailed description taken in conjunction with the accompanying drawings.

FIG. 1 is a cross-sectional view illustrating an ESC in accordance with an example embodiment;

FIG. 2 is a plan view illustrating a protecting ring of the ESC in FIG. 1;

FIG. 3 is a plan view illustrating a protecting ring in accordance with an example embodiment;

FIG. 4 is a cross-sectional view illustrating an ESC in accordance with an example embodiment;

FIG. 5 is a cross-sectional view illustrating an apparatus for processing a substrate including the ESC in FIG. 1 in accordance with an example embodiment;

FIG. 6 is a cross-sectional view illustrating an apparatus for processing a substrate including the ESC in FIG. 1 in accordance with an example embodiment;

FIG. 7 is a cross-sectional view illustrating an apparatus for processing a substrate including the ESC in FIG. 1 in accordance with an example embodiment; and FIG. 8 is a cross-sectional view illustrating an apparatus for processing a substrate including the ESC in FIG. 1 in accordance with an example embodiment.

DETAILED DESCRIPTION OF EXAMPLE EMBODIMENTS

Figure 1:
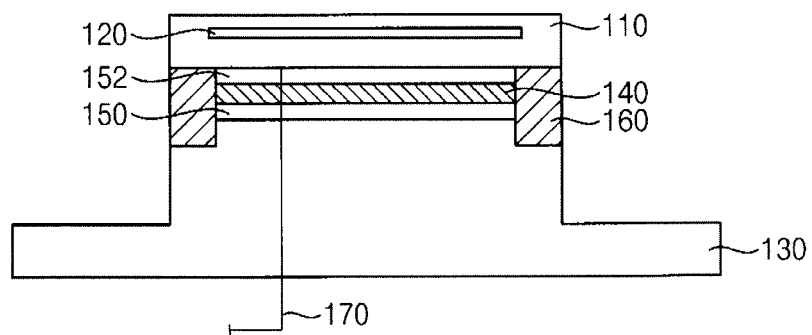
FIGS. 1 to 8 represent non-limiting, example embodiments as described herein.

Various example embodiments will be described more fully hereinafter with reference to the accompanying drawings, in which example embodiments are shown. Example embodiments of the present invention may, however, be embodied in many different forms and should not be construed as limited to example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals refer to like elements throughout. As used herein, the term "and/or" includes any and all combinations of one or more of the associated listed items.

The terminology used herein is for the purpose of describing particular example embodiments only and is not intended to be limiting of example embodiments of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, example embodiments will be explained in detail with reference to the accompanying drawings.

ESC

Figure 2:
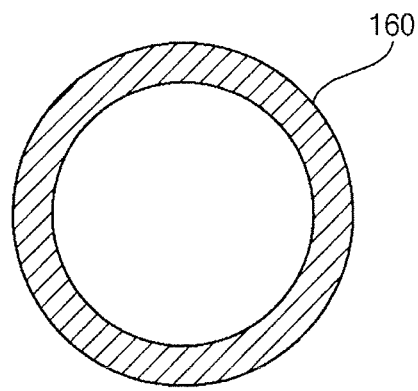

FIG. 1 is a cross-sectional view illustrating an ESC in accordance with an example embodiment, and FIG. 2 is a plan view illustrating a protecting ring of the ESC in FIG. 1.

Referring to FIGS. 1 and 2, an ESC 100 of this example embodiment may include, for example, a dielectric layer 110, an electrode 120, a pedestal 130, a heater 140, a lower adhesive 150, an upper adhesive 152, a protecting ring 160 and a cooling line 170.

The dielectric layer 110 may support a substrate. Thus, the substrate may be positioned on an upper surface of the dielectric layer 110. The dielectric layer 110 may fix the substrate using an electrostatic force. In an example embodiment, the dielectric layer 110 may have, for example, a circular horizontal cross-section. The substrate may include, for example, a semiconductor substrate, a glass substrate, etc.

The electrode 120 may be built in, for example, the dielectric layer 110. For example, a radio frequency (RF) power may be connected to the electrode 120 to form plasma from a reaction gas. In an example embodiment, the electrode 120 may function as a lower electrode of an apparatus for processing the substrate.

The pedestal 130 may be arranged under the dielectric layer 110. The pedestal 130 may be located, for example, on a bottom surface of a reaction chamber in the processing apparatus. In an example embodiment, the pedestal 130 may have, for example, a circular horizontal cross-section. Further, the pedestal 130 may have, for example, an outer diameter substantially the same as an outer diameter of the dielectric layer 110.

The heater 140 may be arranged, for example, between the pedestal 130 and the dielectric layer 110. The heater 140 may heat the substrate on the upper surface of the dielectric layer 110. In an example embodiment, the heater 140 may have, for example, an outer diameter shorter than the outer diameters of the dielectric layer 110 and the pedestal 130. Thus, edge portions of lower surfaces of the dielectric layer 110 and the pedestal 130 may be exposed from the heater 140.

The lower adhesive 150 may be, for example, interposed between the pedestal 130 and the heater 140 to attach a lower surface of the heater 140 to an upper surface of the pedestal 130. The upper adhesive 152 may be, for example, interposed between the heater 140 and the dielectric layer 110 to attach an upper surface of the heater 140 to a lower surface of the dielectric layer 110. In an example embodiment, the lower adhesive 150 and the upper adhesive 152 may have, for example, substantially the same outer diameter as one another. Further, the outer diameter of the lower adhesive 150 and the upper adhesive 152 may be, for example, substantially the same as the outer diameter of the heater 140. Therefore, the edge portion of the lower surface of the dielectric layer 110 may be exposed from the upper adhesive 152. Further, the edge portion of the lower surface of the pedestal 130 may be exposed from the lower adhesive 150.

The cooling line 170 may be connected to the dielectric layer 110 through, for example, the pedestal 130, the lower adhesive 150, the heater 140 and the upper adhesive 152. A coolant may be supplied to the dielectric layer 110 through the cooling line 170 to cool the substrate.

The protecting ring 160 may be configured to, for example, surround the lower adhesive 150 and the upper adhesive 152. Thus, the protecting ring 160 may prevent the lower adhesive 150 and the upper adhesive 152 from being exposed to the plasma. Further, the protecting ring 160 also may protect the cooling line 170 in the lower adhesive 150 and the upper adhesive 152. Therefore, the protecting ring 160 may prevent the coolant passing through the cooling line 170 from being leaked.

In an example embodiment, the protecting ring 160 may include, for example, a plasma-resistant material. For example, the protecting ring 160 may include a ceramic, a metal, etc. For example, the protecting ring 160 may include aluminum.

In an example embodiment, as shown in FIGS. 1 and 2, the protecting ring 160 may include, for example, one body configured to surround the heater 140 as well as the lower adhesive 150 and the upper adhesive 152. Thus, the protecting ring 160 may have, for example, a thickness substantially equal to or slightly greater than a summed thickness of the lower adhesive 150, the heater 140 and the upper adhesive 152. Further, the protecting ring 160 may have, for example, an outer diameter substantially the same as an outer diameter of the dielectric layer 110 and the pedestal 130. Thus, the protecting ring 160 may have, for example, a side outer surface substantially coplanar with side outer surfaces of the dielectric layer 110 and the pedestal 130.

In an example embodiment, the protecting ring 160 may be, for example, a separate part from the dielectric layer 110 or the pedestal 130. In assembling the protecting ring 160, the lower adhesive 150 may be formed, for example, on the upper surface of the pedestal 130. The heater 140 may be attached to, for example, the lower adhesive 150. The upper adhesive 150 may be formed on the upper surface of the heater 140. The protecting ring 160 may, for example, surround the side outer surfaces of the lower adhesive 150, the heater 140 and the upper adhesive 152. The dielectric layer 110 in which the electrode 120 may be built may be arranged on, for example, the upper adhesive 152. Therefore, because the protecting ring 160 may be the separate part from the dielectric layer 110 and the pedestal 130, only the protecting ring 160 may need to be replaced by a new one in the event that the protection ring 160 is either worn or damaged.

Figure 3:
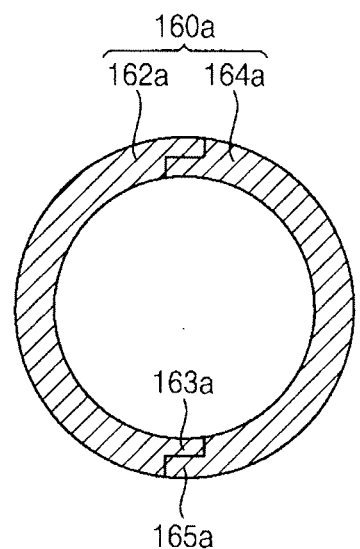

FIG. 3 is a plan view illustrating a protecting ring in accordance with an example embodiment.

Referring to FIG. 3, a protecting ring 160a of this example embodiment may include, for example, a first ring 162a and a second ring 164a. The first ring 162a and the second ring 164a may have, for example, a semi-annular shape. Thus, the first ring 162a and the second ring 164a may, for example, be combined with each other to form the protecting ring 160a having an annular shape. Because the protecting ring 160a may include the detachable first and second rings 162a and 164a, the protecting ring 160a may not be damaged by a thermal expansion. Alternatively, in an example embodiment, the protecting ring 160a may include, for example, at least three rings.

In an example embodiment, the first ring 162a may have, for example, a fixing projection 163a. The second ring 164a may have, for example, a fixing groove 165a. The fixing projecting 163a may be inserted into, for example, the fixing groove 165a so that the first ring 162a and the second ring 164a may be combined with each other. A fixing member such as, for example, a bolt, a screw, etc., may be threadedly inserted into the fixing projection 163a to firmly secure the first ring 162a to the second ring 164a.

Figure 4:
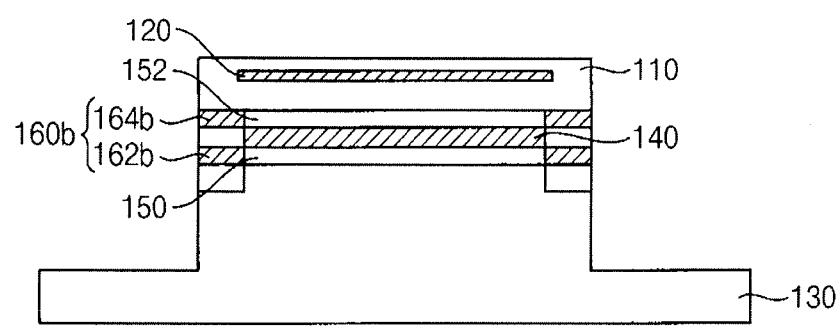

FIG. 4 is a cross-sectional view illustrating an ESC in accordance with an example embodiment.

An ESC 100b of this example embodiment may include elements substantially the same as those of the ESC 100 in FIG. 1 except for a protecting ring. Thus, reference numerals of the present exemplary embodiment of FIG. 4 which are the same as reference numerals used in connection with the ESC 100 of FIG. 1 may refer to the same elements and therefore any further illustrations with respect to these same elements may be omitted herein for brevity.

Referring to FIG. 4, the ESC 100b of this example embodiment may include, for example, a protecting ring 160b. The protecting ring 160b may include, for example, a lower ring 162b and an upper ring 164b.

The lower ring 162b may be configured to, for example, surround only the lower adhesive 150. Thus, the lower ring 162b may have, for example, a thickness substantially equal to or slightly greater than a thickness of the lower adhesive 150.

The upper ring 164b may be configured to, for example, surround only the upper adhesive 152. Thus, the upper ring 164b may have, for example, a thickness substantially equal to or slightly greater than a thickness of the upper adhesive 152.

In an example embodiment, because the protecting ring 160b may include the lower ring 162b and the upper ring 164b, the heater 140 may be exposed through the protecting ring 160b.

Alternatively, in an exemplary embodiment, each of the lower ring 162b and the upper ring 164b may include, for example, a plurality of separate type rings similar to the protecting ring 160a in FIG. 3.

Apparatus for Processing a Substrate

Figure 5:
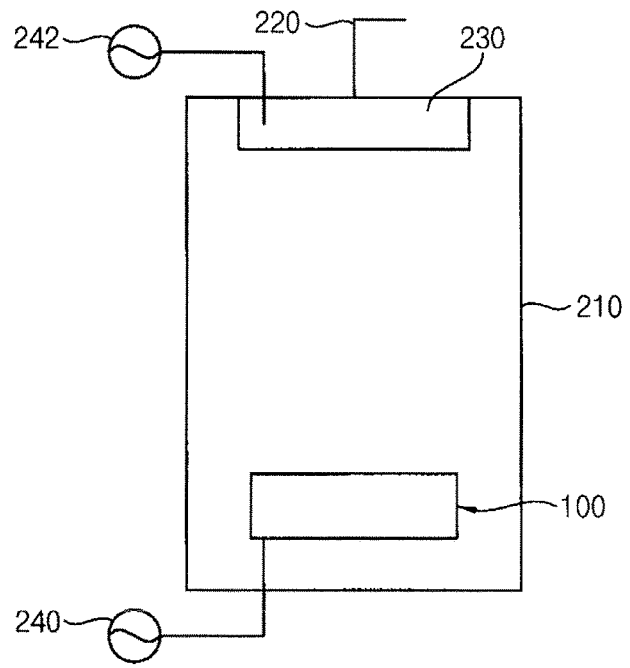

FIG. 5 is a cross-sectional view illustrating an apparatus for processing a substrate including the ESC in FIG. 1 in accordance with an example embodiment.

Referring to FIG. 5, a processing apparatus 200 of this example embodiment may include, for example, a reaction chamber 210, an ESC 100, a reaction gas line 220, a showerhead 230 and RF powers 240 and 242.

The ESC 100 may be arranged on, for example, the bottom surface of the reaction chamber 210. The RF power 240 may be, for example, electrically connected to the ESC 100. In an example embodiment, the ESC 100 may include elements substantially the same as those of the ESC 100 in FIG. 1. Thus, the same reference numeral "100" used to refer to the ESC 100 in FIG. 1 is also being used herein to refer to the ESC of the present example embodiment of FIG. 5 to denote that they are the same element and therefore any further illustrations with respect to these same elements may be omitted herein for brevity. Alternatively, in an example embodiment, the processing apparatus 200 may include an ESC including, for example, the protecting ring 160a in FIG. 3, or the ESC 100b in FIG. 4.

The reaction gas line 220 may be, for example, connected to an upper surface of the reaction chamber 210. A reaction gas may be supplied, for example, into the reaction chamber 210 through the reaction gas line 220.

The showerhead 230 may be positioned, for example, at an upper inner space of the reaction chamber 210. The reaction gas line 220 may be connected to, for example, the showerhead 230. The showerhead 230 may, for example, spray the reaction gas supplied through the reaction gas line 220 to the substrate on the ESC 100. The RF power 242 may be connected to, for example, the showerhead 230. The showerhead 230 may form an electric field in the reaction chamber 210 together with the electrode 120 of the ESC 100 to generate the plasma from the reaction gas. That is, the showerhead 230 may function as an upper electrode of the processing apparatus 200.

In an example embodiment, a function of the processing apparatus 200 may be determined in accordance with the kinds of the reaction gas supplied through the reaction gas line 220. For example, when an etching gas is supplied through the reaction gas line 220, the processing apparatus 200 may correspond to an etching apparatus. Moreover, when a deposition gas is supplied through the reaction gas line 220, the processing apparatus 200 may correspond to a deposition apparatus.

Figure 6:
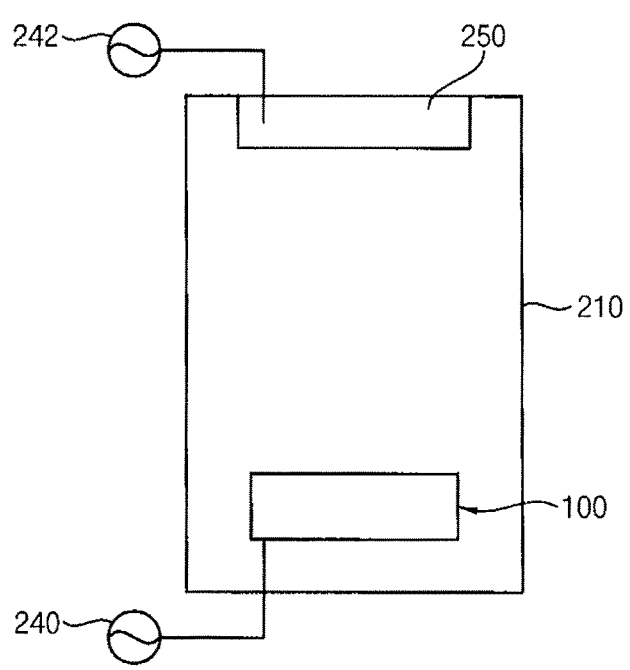

FIG. 6 is a cross-sectional view illustrating an apparatus for processing a substrate including the ESC in FIG. 1 in accordance with an example embodiment.

Referring to FIG. 6, a processing apparatus 200a of this example embodiment may correspond to an ion implantation apparatus. Thus, the processing apparatus 200a of this example embodiment may include, for example, a reaction chamber 210, an ESC 100, a reaction gas line 255, an RF antenna 250 and RF powers 240 and 242.

The ESC 100 may be arranged on, for example, the bottom surface of the reaction chamber 210. The RF power 240 may be, for example, electrically connected to the ESC 100. In an example embodiment, the ESC 100 may include elements substantially the same as those of the ESC 100 in FIG. 1. Thus, the same reference numeral "100" used to refer to the ESC 100 in FIG. 1 is also being used herein to refer to the ESC of the present example embodiment of FIG. 6 to denote that they are the same element and therefore any further illustrations with respect to these same elements may be omitted herein for brevity. Alternatively, in an example embodiment, the processing apparatus 200a may include an ESC including, for example, the protecting ring 160a in FIG. 3, or the ESC 100b in FIG. 4.

The reaction gas line 255 may be connected to, for example, a side surface of the reaction chamber 210. A reaction gas may be supplied into the reaction chamber 210 through, for example, the reaction gas line 255.

The RF antenna 250 may be positioned at, for example, an upper surface of the reaction chamber 210. The RF power 242 may be connected to, for example, the RF antenna 250. The RF antenna 250 may form an electric field in the reaction chamber 210 together with the electrode 120 of the ESC 100 to generate plasma ions from the reaction gas. The plasma ions may be accelerated toward the substrate to implant the plasma ion into the substrate.

Figure 7:
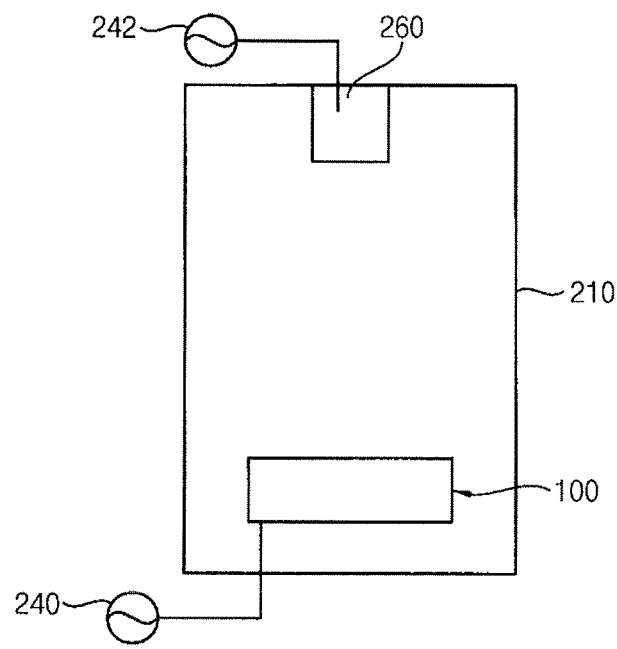

FIG. 7 is a cross-sectional view illustrating an apparatus for processing a substrate including the ESC in FIG. 1 in accordance with an example embodiment.

Referring to FIG. 7, a processing apparatus 200b of this example embodiment may correspond to an ion implantation apparatus. Thus, the processing apparatus 200b of this example embodiment may include, for example, a reaction chamber 210, an ESC 100, an ion beam-irradiating unit 260 and RF powers 240 and 242.

The ESC 100 may be arranged on, for example, the bottom surface of the reaction chamber 210. The RF power 240 may be electrically connected to, for example, the ESC 100. In an example embodiment, the ESC 100 may include elements substantially the same as those of the ESC 100 in FIG. 1. Thus, the same reference numeral "100" used to refer to the ESC 100 in FIG. 1 is also being used herein to refer to the ESC of the present example embodiment of FIG. 7 to denote that they are the same element and therefore any further illustrations with respect to these same elements may be omitted herein for brevity. Alternatively, in an example embodiment, the processing apparatus 200b may include an ESC including, for example, the protecting ring 160a in FIG. 3, or the ESC 100b in FIG. 4.

The ion beam-irradiating unit 260 may be positioned at, for example, an upper surface of the reaction chamber 210. The RF power 242 may be connected to, for example, the ion beam-irradiating unit 260. The ion beam-irradiating unit 260 may irradiate ion beams to the substrate on the ESC 100 in, for example, a vertical direction.

Figure 8:
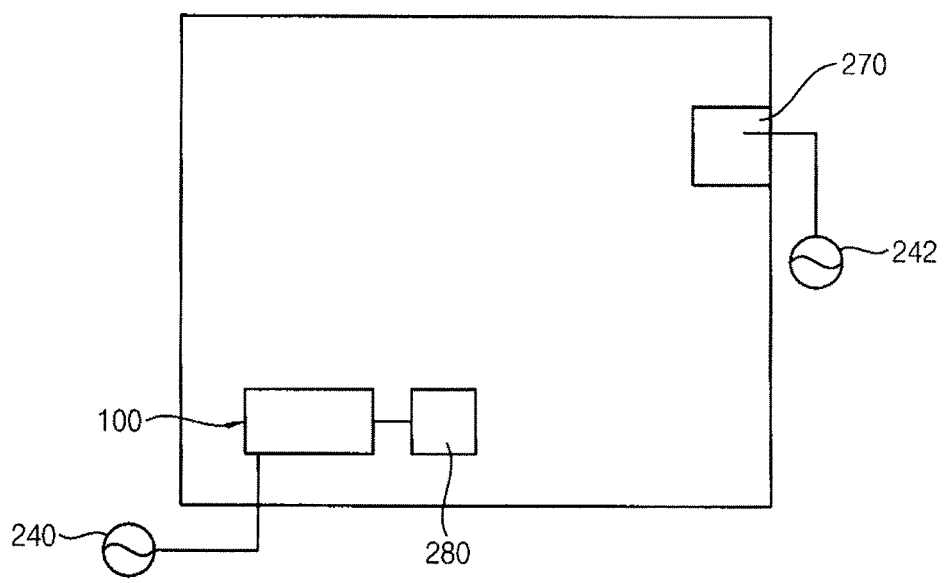

FIG. 8 is a cross-sectional view illustrating an apparatus for processing a substrate including the ESC in FIG. 1 in accordance with an example embodiment.

Referring to FIG. 8, a processing apparatus 200c of this example embodiment may correspond to an ion implantation apparatus. Thus, the processing apparatus 200c of this example embodiment may include, for example, a reaction chamber 210, an ESC 100, an ion beam-irradiating unit 270, a rotating unit 280 and RF powers 240 and 242.

The ESC 100 may be arranged on, for example, the bottom surface of the reaction chamber 210. The RF power 240 may be, for example, electrically connected to the ESC 100. In an example embodiment, the ESC 100 may include elements substantially the same as those of the ESC 100 in FIG. 1. Thus, the same reference numeral "100" used to refer to the ESC 100 in FIG. 1 is also being used herein to refer to the ESC of the present example embodiment of FIG. 8 to denote that they are the same element and therefore any further illustrations with respect to these same elements may be omitted herein for brevity. Alternatively, in an example embodiment, the processing apparatus 200c may include an ESC including, for example, the protecting ring 160a in FIG. 3, or the ESC 100b in FIG. 4.

The ion beam-irradiating unit 270 may be positioned at, for example, a side surface of the reaction chamber 210. The RF power 242 may be connected to, for example, the ion beam-irradiating unit 270. The ion beam-irradiating unit 270 may irradiate ion beams to the substrate on the ESC 100 in, for example, a horizontal direction.

The rotating unit 280 may rotate the ESC 100 at an angle of, for example, about 90° to erect the upper surface of the ESC 100. That is, the rotating unit 280 may rotate the ESC 100 to be, for example, disposed opposite to the ion beam-irradiating unit 270. Therefore, the ions emitted from the ion beam-irradiating unit 270 may be irradiated to the substrate on the upper surface of the ESC 100.

According to example embodiments, the protecting ring having a plasma-resistant material may surround the adhesive so that the adhesive may not be exposed to the plasma owing to the protecting ring. Further, because the protecting ring may be a separate part from the dielectric layer or the pedestal, only the protecting ring may need to be replaced by a new one in the event that the protecting ring is worn or damaged. Therefore, the ESC may have a long life span and particles may not be generated.

Having described example embodiments of the present invention, it is further noted that it is readily apparent to those of ordinary skill in the art that various modifications may be made without departing from the spirit and scope of the present invention which defined by the metes and bounds of the appended claims.

What is claimed is:

1. An electrostatic chuck (ESC) comprising:
a dielectric layer configured to support a substrate;
an electrode disposed in the dielectric layer and configured to form plasma over the substrate;
a pedestal disposed under the dielectric layer;
a heater disposed between the pedestal and the dielectric layer and configured to heat the substrate;
a lower adhesive disposed between the pedestal and the heater;
an upper adhesive disposed between the heater and the dielectric layer; and
a protecting ring configured to surround the lower and upper adhesives, wherein the protecting ring includes a plasma-resistant material,
wherein the protective ring comprises:
a first ring having a thickness substantially equal to a thickness of the lower adhesive and configured to surround the lower adhesive; and
a second ring having a thickness substantially equal to a thickness of the upper adhesive and configured to surround the upper adhesive,
wherein the heater is exposed through a space between the first ring and the second ring.

2. The ESC of claim 1, wherein the protecting ring comprises separate type rings.

3. The ESC of claim 2, wherein the separate type rings comprise a fixing groove and a fixing projection.

4. The ESC of claim 1, wherein the protecting ring has an outer diameter substantially the same as an outer diameter of the dielectric layer.

5. The ESC of claim 1, wherein the protecting ring comprises one of a ceramic or a metal.

6. The ESC of claim 1, further comprising a cooling line connected to the dielectric layer through the pedestal, the adhesive and the heater.

7. The ESC of claim 1, wherein the first ring is not in contact with the second ring.

8. An apparatus for processing a substrate, the apparatus comprising:
a reaction chamber;
an electrostatic chuck (ESC) disposed in the reaction chamber and configured to support the substrate using an electrostatic force; and
a processing unit disposed in the reaction chamber and configured to process the substrate,
wherein the ESC comprises:
a dielectric layer configured to support the substrate;
an electrode disposed in the dielectric layer and configured to form plasma over the substrate;
a pedestal disposed under the dielectric layer;
a heater disposed between the pedestal and the dielectric layer and configured to heat the substrate;
a lower adhesive disposed between the pedestal and the heater;
an upper adhesive disposed between the heater and the dielectric layer; and
a protecting ring configured to surround the lower and upper adhesives,
wherein the protecting ring includes a plasma-resistant material, and
wherein the protective ring comprises:
a first ring having a thickness substantially equal to a thickness of the lower adhesive and configured to surround the lower adhesive; and
a second ring having a thickness substantially equal to a thickness of the upper adhesive and configured to surround the upper adhesive,
wherein the heater is exposed through a space between the first ring and the second ring.

9. The apparatus of claim 8, wherein the processing unit comprises:
a reaction gas line configured to supply a reaction gas to the substrate; and
a showerhead connected to the reaction gas line and configured to spray the reaction gas to the substrate and to form the plasma from the reaction gas together with the electrode.

10. The apparatus of claim 8, wherein the processing unit comprises:
a reaction gas line configured to supply a reaction gas to the substrate; and
a radio frequency (RF) antenna configured to form plasma ions from the reaction gas together with the electrode.

11. The apparatus of claim 8, wherein the processing unit comprises an ion beam-irradiating unit configured to irradiate an ion beam to the substrate.

12. The apparatus of claim 11, wherein the ion beam-irradiating unit is disposed at an upper surface of the reaction chamber and configured to irradiate the ion beam to the ESC in a vertical direction.

13. The apparatus of claim 11, wherein the ion beam-irradiating unit is disposed at a side surface of the reaction chamber and configured to irradiate the ion beam to the ESC in a horizontal direction, and wherein the apparatus further comprises a rotating unit configured to rotate the ESC to be disposed opposite to the ion beam-irradiating unit.

14. The apparatus of claim 8, further comprising a first radio frequency (RF) power electrically connected to the ESC and a second radio frequency (RF) power electrically connected to the processing unit, and wherein the ESC is disposed on a bottom surface of the reaction chamber.

15. The apparatus of claim 8, wherein the first ring is not in contact with the second ring.

* * * * *